United States Patent
Choi et al.

(10) Patent No.: US 12,266,643 B2
(45) Date of Patent: Apr. 1, 2025

(54) DISPLAY DEVICE WITH PIEZOELECTRIC ACTUATOR

(71) Applicant: LG DISPLAY CO., LTD., Seoul (KR)

(72) Inventors: Jaeho Choi, Paju-si (KR); Heesuk Pang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 239 days.

(21) Appl. No.: 17/778,707

(22) PCT Filed: May 17, 2021

(86) PCT No.: PCT/KR2021/006165
§ 371 (c)(1),
(2) Date: May 20, 2022

(87) PCT Pub. No.: WO2022/080618
PCT Pub. Date: Apr. 21, 2022

(65) Prior Publication Data
US 2023/0012674 A1   Jan. 19, 2023

(30) Foreign Application Priority Data
Oct. 16, 2020   (KR) .......... 10-2020-0134620

(51) Int. Cl.
*H04R 17/00* (2006.01)
*H01L 23/00* (2006.01)
*H01L 25/16* (2023.01)
*H10K 50/87* (2023.01)
*H10N 30/88* (2023.01)

(52) U.S. Cl.
CPC ............ *H01L 25/165* (2013.01); *H01L 24/32* (2013.01); *H01L 24/33* (2013.01); *H01L 25/167* (2013.01); *H04R 17/00* (2013.01); *H10K 50/87* (2023.02); *H10N 30/883* (2023.02); *H01L 2224/32245* (2013.01); *H01L 2224/33181* (2013.01); *H04R 2499/15* (2013.01)

(58) Field of Classification Search
CPC ........................... H04R 17/00; H04R 2499/15
USPC ............................................. 381/190
See application file for complete search history.

(56) References Cited

U.S. PATENT DOCUMENTS

| | | | |
|---|---|---|---|
| 10,542,235 B2 | 1/2020 | Shin et al. | |
| 10,911,862 B2 | 2/2021 | Shin et al. | |
| 10,924,704 B2 | 2/2021 | Shin et al. | |
| 11,064,286 B1 * | 7/2021 | Chen | ........................ H04R 1/24 |
| 11,223,896 B2 | 1/2022 | Shin et al. | |

(Continued)

FOREIGN PATENT DOCUMENTS

| | | |
|---|---|---|
| KR | 10-1161943 B1 | 7/2012 |
| KR | 10-2014-0139248 A | 12/2014 |

(Continued)

*Primary Examiner* — Katherine A Faley
(74) *Attorney, Agent, or Firm* — Birch, Stewart, Kolasch & Birch, LLP

(57) ABSTRACT

The present disclosure relates to a display device including a piezoelectric film type actuator, the display device having a structure in which a groove is provided in a rear surface of a metal layer for supporting and encapsulate a rear surface of a display panel and the piezoelectric film type actuator is disposed in the groove. Accordingly, the display device may reduce the overall thickness and improve heat dissipation performance.

8 Claims, 3 Drawing Sheets

(56) References Cited

U.S. PATENT DOCUMENTS

| | | | |
|---|---|---|---|
| 11,675,561 B2* | 6/2023 | Ha | G06F 3/16 |
| | | | 381/152 |
| 2006/0078138 A1* | 4/2006 | Wada | H04R 1/028 |
| | | | 381/306 |
| 2008/0018203 A1* | 1/2008 | Fujiwara | H04R 17/00 |
| | | | 310/324 |
| 2011/0216027 A1 | 9/2011 | Kim et al. | |
| 2013/0272537 A1* | 10/2013 | Tada | H04R 9/022 |
| | | | 381/86 |
| 2014/0347283 A1 | 11/2014 | Kim et al. | |
| 2017/0318401 A1* | 11/2017 | Chang | H04R 1/1075 |
| 2019/0014402 A1* | 1/2019 | Ahn | H05K 7/20963 |
| 2019/0268681 A1* | 8/2019 | Masuda | H04R 9/066 |
| 2020/0183637 A1* | 6/2020 | Ahn | H04R 7/10 |
| 2020/0314515 A1* | 10/2020 | Jang | H10N 30/1051 |
| 2020/0329304 A1 | 10/2020 | Yang et al. | |
| 2021/0136314 A1 | 5/2021 | Shin et al. | |
| 2021/0235186 A1 | 7/2021 | Choi et al. | |

FOREIGN PATENT DOCUMENTS

| | | |
|---|---|---|
| KR | 10-2018-0062320 A | 6/2018 |
| KR | 10-2019-0009188 A | 1/2019 |
| KR | 10-2019-0017264 A | 2/2019 |
| KR | 10-2020-0033597 A | 3/2020 |

\* cited by examiner

DISPLAY DEVICE WITH PIEZOELECTRIC ACTUATOR

CROSS REFERENCE TO RELATED APPLICATIONS

This application is the National Stage filing under 35 U.S.C. 371 of International Application No. PCT/KR2021/006165, filed on May 17, 2021, which claims the benefit of earlier filing date and right of priority to Korean Application No. 10-2020-0134620, filed on Oct. 16, 2020 in the Republic of Korea, the contents of all these applications being hereby incorporated by reference into the present application.

BACKGROUND

Field

Disclosed herein is a display device for providing images, more particularly, a display device for providing sounds along with images, without installing a separate speaker.

Description of Related Art

A display device may include a display panel for providing images. The display panel may include a liquid crystal display panel, an organic light emitting diode display panel, a quantum dot display panel, a micro LED display panel, and the like.

Such the display device may include a speaker for providing sound as well as the display panel. The speaker may be installed in the display device or separately provided as a sound bar. When the speaker is installed in the display device, the speaker may be generally installed on each side surface of the display panel.

When the speaker is installed in the display device, the propagation direction of the sounds generated through the speaker may not be toward the viewer. For example, the sounds generated through the speaker may travel in the side direction of the display panel or the top and bottom directions of the display panel. Accordingly, a sound quality might be deteriorated due to inference with sounds reflected from the wall or floor.

In addition, when installing the speaker in a set device such as a TV, the speaker could occupy a certain space and thus there might be restriction on the design and space arrangement of the set device.

SUMMARY

Technical Problems

Accordingly, an object of the present disclosure is to address the above-noted and other problems. Embodiments of the present disclosure provide a display device that uses piezoelectric film type actuator configured to output sounds in the front direction of the display panel.

Especially, embodiments of the present disclosure may provide a display device using a piezoelectric film type actuator that may suppress an increase in the overall thickness of the device.

Another object of the present disclosure is to provide a display device that may increase an area of a piezoelectric film type actuator.

A further object of the present disclosure is to provide a display device that may have a set drive unit embedded therein to drive a display panel and a piezoelectric film type actuator.

Technical Solutions

An embodiment of the present disclosure provides a display device including a metal layer, a display panel, a piezoelectric film type actuator and an enclosure. The metal layer may support and encapsulate the display panel and emit the heat generated in the display device. At least one groove may be provided in a rear surface of the metal layer. The display panel may be disposed on a front surface of the metal layer. The piezoelectric film type actuator may be disposed in the groove of the metal layer and configured to vibrate the display panel. The enclosure may cover a rear surface of the piezoelectric film type actuator.

Since the piezoelectric film type actuator is disposed in the groove formed in the metal layer, the overall thickness of the display device may be reduced.

To improve heat dissipation performance, a heat dissipation sheet may be disposed on a front surface of the piezoelectric film type actuator. Heat conductivity of the heat dissipation sheet may be higher than heat conductivity of the metal layer. The heat dissipation sheet may be a carbon-based heat dissipation sheet such as a graphite sheet.

A heating element may be disposed on one side of the display panel or the metal layer, and the groove may be disposed closer to the other side opposite to the side where the heating element is disposed. Accordingly, it may be possible to reduce or prevent deterioration in properties of organic elements of the display, such as organic light emitting devices, due to heat.

A drive for driving the piezoelectric film type actuator may be disposed in other area on the rear surface of the metal layer than the area where the groove is provided. In this instance, an additional cover for covering the rear surface of the metal layer may be provided to protect the exterior of the display.

A display according to another embodiment of the present disclosure may include a metal layer, a display panel, a piezoelectric film type actuator and an enclosure. The metal layer may support and encapsulate the display panel and emit the heat generated in the display device. At least one groove may be provided in a rear surface of the metal layer. The display panel may be disposed on a front surface of the metal layer. The piezoelectric film type actuator may be disposed in the groove of the metal layer. The enclosure may cover even lateral surfaces as well as a rear surface of the piezoelectric film type actuator.

When the groove is larger than the piezoelectric film type actuator in the display device, the enclosure may fill in an air gap. Accordingly, vibration area may be widened and heat dissipation performance may be improved.

In a further implementation, embodiment of the present disclosure may also provide a display device including a metal layer, a display panel, a drive, a piezoelectric film type actuator; and an enclosure. A groove may be provided in a rear surface of the metal layer. The drive may be provided in the groove and a piezoelectric film type actuator may be disposed at least one side of the drive in the groove of the metal layer. The enclosure may cover a rear surface of the drive and a rear surface of the piezoelectric film type actuator.

The display device according to this embodiment may widen vibration area. In addition, since the enclosure may cover the drive and the connecting wires, the display device may improve the exterior of the back side.

Detailed explanations of other embodiments and implementations may be included in the detailed descriptions and the accompanying drawings.

Advantageous Effect

The piezoelectric film type actuator may be disposed in the groove provided in the metal layer. Accordingly, the present disclosure has an advantageous effect that the overall thickness of the display device is reduced.

In addition, a vibration area may be widened, even if the size of the piezoelectric film type actuator is relatively small, and also heat dissipation performance may be improved.

In addition, the enclosure may cover the drive and the connecting wires. Accordingly, the display device may improve the exterior of the back side.

The display device according to the present disclosure having the above-mentioned advantageous effects may be applied to a television, a monitor, a notebook computer, a smart phone, a tablet computer, an electronic notebook, an electronic pad, a wearable device, a watch phone, a portable information device, a navigation device, a display device for a vehicle, and the like.

The advantageous effects of the display device may not be limited what is mentioned above. Other effects that are not mentioned above may be understood and expected from following detailed descriptions of embodiments by people those skilled in the art.

DETAILED DESCRIPTIONS

Figure 1:
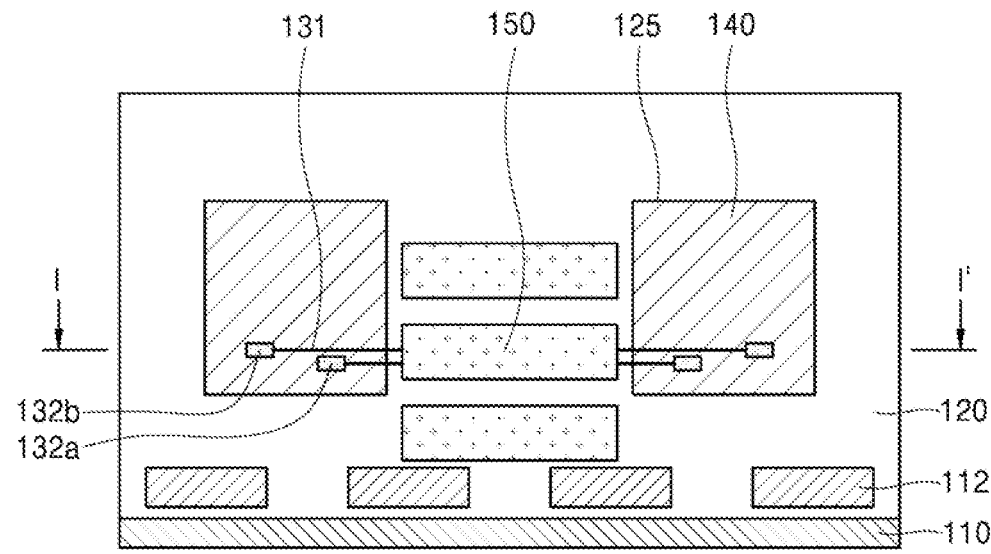
FIG. 1 shows schematically a rear surface of a display device according to one embodiment.

Hereinafter, the above-described aspects, features and advantages are specifically described hereunder with reference to the accompanying drawings such that one having ordinary skill in the art to which the present disclosure pertains easily can implement the technical spirit of the disclosure.

The present disclosure is not intended to limit the embodiments and drawings set forth herein, and numerous other modifications and embodiments can be devised. Regardless of numeral references, the same or equivalent components may be provided with the same reference numbers and description thereof will not be repeated. For the sake of brief description with reference to the drawings, the sizes and profiles of the elements illustrated in the accompanying drawings may be exaggerated or reduced and it should be understood that the embodiments presented herein are not limited by the accompanying drawings.

Hereinafter, expressions of 'a component is provided or disposed in an upper or lower portion' may mean that the component is provided or disposed in contact with an upper surface or a lower surface. The present disclosure is not intended to limit that other elements are provided between the components and on the component or beneath the component. It will be understood that when an element is referred to as being "connected with" another element, the element can be directly connected with the other element or intervening elements may also be present. In contrast, when an element is referred to as being "directly connected with" another element, there are no intervening elements present.

Hereinafter, expressions of 'a component is provided or disposed in an upper or lower portion' may mean that the component is provided or disposed in contact with an upper surface or a lower surface. The present disclosure is not intended to limit that other elements are provided between the components and on the component or beneath the component. Spatially relative terms may be understood as terms including different orientations of the device during use or operation in addition to the orientation shown in the drawings. For example, when an element shown in the drawings is turned over, an element described as "below" may be placed "above" another element. Accordingly, the exemplary term "below" may include both directions below and above.

It will be understood that although the terms used in the disclosure may be used herein to describe various embodiments, and the embodiments should not be limited by these terms. A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated.

Figure 2:
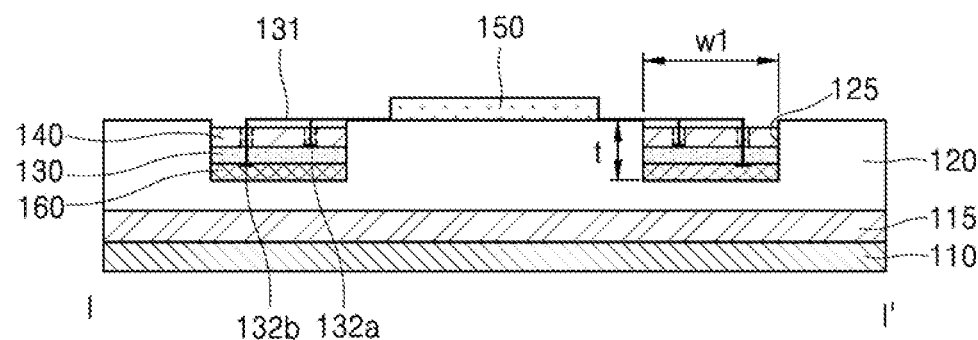
FIG. 2 is a sectional view schematically illustrating the display device shown in FIG. 1.

FIG. 1 shows schematically a rear surface of a display device according to one embodiment. FIG. 2 is a sectional view schematically illustrating the display device shown in FIG. 1.

Referring to FIGS. 1 and 2, the display device may include a display panel 110, a metal layer 120, a piezoelectric film type actuator 130 and an enclosure 140.

The display panel 110 may be configured to provide images and it may be an organic light emitting diode display panel. However, the display panel 110 according to the present disclosure may not be limited and it may be one of the well-known display panels such as a liquid crystal display panel, a quantum dot display panel, a micro LED display panel, and the like.

The display panel 110 may be disposed on a front surface of the metal layer 120. Referring to FIG. 1, one side of the display panel 110 may be exposed to a rear surface. Various pads such as a source pad may be disposed on the exposed rear surface of the display panel 110. For example, the source pad may be electrically connected to a source PCB 112 disposed on one side of the rear surface of the metal layer 120.

The display panel 110 and the metal layer 120 may be attached to each other by means of an adhesive layer 115. In the present disclosure, the adhesive layer 115 (310 of FIG. 3) may refer to a layer including a pressure-sensitive adhesive or an adhesive having temporary or semi-permanent adhesion performance.

To improve the encapsulation properties of the adhesive layer 115, the adhesive layer 115 may further include a getter material e.g., CaO and BaO which have moisture absorption properties. It may be more preferable that the getter material is provided in the adhesive layer 115, when the display panel 110 is an organic light emitting diode display panel. Here, the technical feature may be applied to other display panels rather than the organic light emitting diode display panel, in that the getter material is provided in the adhesive layer 115.

The metal layer 120 may support the rear surface of the display panel 110 and function as encapsulation that prevents moisture from entering the display panel 110. In addition, the metal layer 120 may also function as a heat sink for dissipating the heat generated in the display device.

To perform the above-mentioned functions, the metal layer 120 may include aluminum, copper, iron or the like. The metal layer 120 according to the present disclosure may refer to a layer including a metal. The metal layer may be in the form of a single metal or an alloy, or a metal carbon composite.

At least one groove 125 may be provided in a rear surface of the metal layer 120 according to the present disclosure. The groove 125 may have a complete groove wall such as one example shown in FIG. 2. As another example, the groove 125 may be a step portion that is opened laterally by removing a certain area of the groove wall.

The piezoelectric film type actuator 130 may be disposed in the groove 125. As the piezoelectric film type actuator 130 is arranged in the groove 125, it may be possible to prevent an increase in the thickness of the display device due to the addition of the piezoelectric film type actuator 130. In addition, the display device according to the present disclosure may output sound in a front direction of the display panel even without a separate speaker, because the piezoelectric film type actuator for outputting sound is arranged in the groove provided in the rear surface of the metal layer attached to the rear surface of the display panel.

The enclosure 140 may cover a rear surface of the piezoelectric film type actuator 130. The enclosure 140 may seal the groove 125 in which the piezoelectric film type actuator 130 is disposed. The enclosure 140 may be formed of a material including a metal. For example, the enclosure 140 may be made of the same material as the metal layer 120.

The enclosure 140 may be configured to absorb the sound generated to the rear surface of the piezoelectric film type actuator 130 so as to prevent interference of sound generated from the piezoelectric film type actuator 130. The sound generated by each of the piezoelectric film type actuators 130 may not be interfered due to the enclosure 140. Accordingly, sound output characteristics may be improved.

The rear surface of the enclosure 140 and the rear surface of the metal layer 120 may form the same plane or the rear surface of the enclosure 140 may slightly protrude from the rear surface of the metal layer 120, or vice versa.

The display device according to the present disclosure may further include a drive 150. The drive 150 may include a power supply and a controller, and configured to drive the display panel 110 and the piezoelectric film type actuator 130. FIGS. 1 and 2 show only an example of electrical connection between the drive 150 and the piezoelectric film type actuator 130. Electric connection between the drive 150 and the display panel 110 is omitted in FIGS. 1 and 2 and any well-known connection methods may be applied to the electric connection between them.

As shown in FIGS. 1 and 2, the drive 150 may be disposed in the other area of the metal layer 120 except the area in which the groove 125 is provided on the rear surface of the metal layer 120. When it is disposed on the rear surface of the metal layer 120, the drive 150 and a connecting wire 131, etc. may be exposed on the rear surface of the metal layer 120 such that the rear appearance of the display device may not be neat and clean. In this instance, the drive 150 and the connecting wire 131 and the exposed area (a lower area of FIG. 1) of the display panel 110 may be covered by an additional cover (not shown).

Referring to FIGS. 1 and 2, the drive 150 and the piezoelectric film type actuator 130 may be electrically connected with each other via connecting wires 131. In addition, the piezoelectric film type actuator 130 may include a terminal portion 132a and 132b for contacting or fixing the connecting wires 131.

Figure 3:
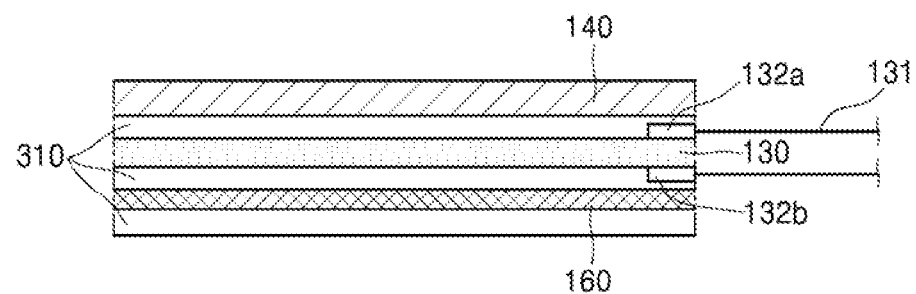
FIG. 3 shows one example of arrangement of a piezoelectric film type actuator, an enclosure and a heat dissipation sheet.

The connecting wires 131 may be connected to the piezoelectric film type actuator 130 disposed in the groove 125 in various ways. For example, the connecting wires 131 may pass through the enclosure 140 as in the example shown in FIG. 2, bypass along the lateral surface of the enclosure, or be located in the front surface of the enclosure as shown in FIG. 3.

When the piezoelectric film type actuator 130 is vibrated in a predetermined vibration pattern by the drive 150, such vibration may be transmitted to the display panel through a thin metal layer part where the groove is formed, and sound may be output. In case a plurality of piezoelectric film type actuators 130 are provided, the drive 150 may simultaneously drive the piezoelectric film type actuator 130. As another example, the drive may individually drive the piezoelectric film type actuators 130.

To transmit the vibration to the display panel 110, the metal layer part where the groove 125 is formed needs to be as thin as possible. For example, the thickness of the metal layer part having the groove 125 may be approximately 0.5 mm or less.

Meanwhile, the thickness in the other area than the area where the groove 125 is formed may be determined in consideration of heat dissipation performance and encapsulation performance. When a structure such as a bottom cover is further provided in the display device, the thickness of the metal layer may be reduced.

An example of the structure of the piezoelectric film actuator usable in the display device according to the present disclosure will be described later with reference to FIG. 8.

Referring to FIG. 2, the heat dissipation sheet 160 may be disposed on a front surface of the piezoelectric film type actuator 130. The area where the groove 125 is formed may be thinner than the other area in the metal layer 120. In addition, the piezoelectric film type actuator 130 having relatively low heat conductivity may be disposed in the groove 125. For example, when the piezoelectric film actuator 130 is made of $PtZrTiO_3$ material, the thermal conductivity of $PtZrTiO_3$ is about 2.1 W/mk, which is only about $1/100$ of the thermal conductivity of aluminum 237 W/mk. Accordingly, the area in which the groove 125 is formed may have lower heat dissipation performance, compared to the other areas. The heat dissipation sheet 160 may serve to reinforce the heat dissipation performance of the area where the groove 125 in the metal layer 120 is formed.

To improve the heat dissipation performance of the area where the groove 125 of the metal layer 120 is formed, the heat dissipation sheet 160 may be a carbon-based heat dissipation sheet having higher heat conductivity than that of the metal layer 120. The carbon-based heat dissipation sheet may be a graphite sheet, a graphene sheet, a carbon nanotube sheet, or the like. For example, graphite having a high heat conductivity of 400 to 600 W/mk has higher heat conductivity than that of aluminum of 237 W/m. Accordingly, it is advantageous in terms of heat dissipation to use the carbon-based heat dissipation sheet as the heat dissipation sheet 160.

FIG. 3 shows one example of arrangement of a piezoelectric film type actuator, an enclosure and a heat dissipation sheet.

Referring to FIG. 3, an adhesive layer 310 may be arranged between the piezoelectric film type actuator 130 and the enclosure 140 to secure the connection between the piezoelectric film type actuator 130 and the enclosure 140. The adhesive layer 310 may be disposed on the front surface of the enclosure 140 and embodiments of the present disclosure may not be limited thereto. The adhesive layer 310 may be disposed on the rear surface of the piezoelectric film type actuator 130.

As shown in FIG. 3, the adhesive layer 310 may be disposed between the heat dissipation sheet 160 and the piezoelectric film type actuator 130 as well as between the dissipation sheet 160 and the metal layer 120.

Figure 4:
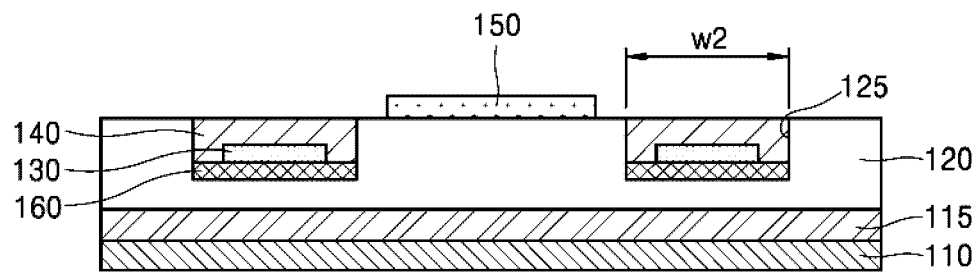
FIG. 4 is a sectional view schematically illustrating a display device according to another embodiment.

FIG. 4 schematically illustrates a cross section of a display device according to another embodiment.

Like the display shown in FIG. 2, the display device shown in FIG. 4 may include the display panel 110, the metal layer 120, the piezoelectric film type actuator 130 and the enclosure 140. In addition, at least one groove 125 may be provided in the rear surface of the metal layer and the piezoelectric film type actuator 130 may be disposed in the groove 125 of the metal layer.

However, unlike the display device shown in FIG. 2, the enclosure 140 of the display device shown in FIG. 4 may cover even the lateral surfaces as well as the rear surface of the piezoelectric film type actuator 130.

The groove size may be sometimes larger than the size of the piezoelectric film type actuator. For example, even if piezoelectric film type actuators having the same size are disposed, it may be expected that the groove size w2 of the metal layer shown in FIG. 4 could be larger than the groove size w1 of the metal layer shown in FIG. 2. Or, if the size of the piezoelectric film type actuator is limited, it could be also expected that the size could be smaller than the groove size.

In this case, an air gap is likely to be generated in the lateral surface of the piezoelectric film type actuator 130. According to this embodiment, the enclosure 140 may cover even the lateral surface as well as the rear surface of the piezoelectric film type actuator 130 such that the air gap formed in the lateral surface of the piezoelectric film type actuator 130 may be filled. Accordingly, the vibration area of the display panel 110 may be widened, and heat dissipation performance may be improved. The wide vibration area of the display may be advantageous for overall sound pressure and low sound characteristics.

Figure 5:
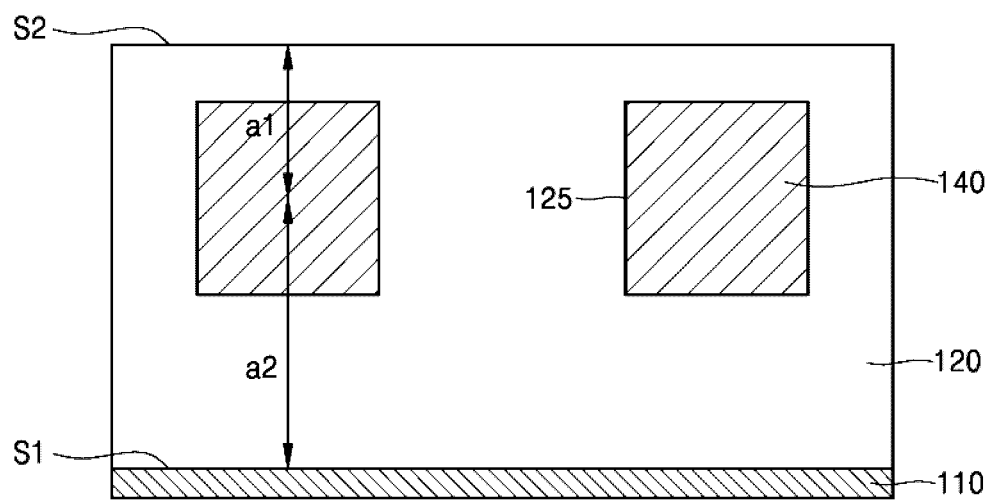
FIG. 5 shows schematically a rear surface of a display device according to a further embodiment.

FIG. 5 shows schematically a rear surface of a display device according to a further embodiment.

Referring to FIG. 1, a heating element may be disposed on either side of the display panel or on any side of the metal layer 120 (typically, the lower surface of the display panel). The heating element may be a source pad, one of various printed circuit boards (e.g., a source PCB), one of various controllers, and the like. Some of them (e.g., a source pad) generate a lot of heat. The area of the metal layer where the groove is formed may have a relatively thin. Accordingly, if the groove is formed adjacent to the heating element in this way, there is a possibility that the characteristics of the organic element provided in the display panel (e.g., an organic light emitting diode) could be deteriorated by heat.

In the embodiment shown in FIG. 5, the groove 125 of the metal layer 120 may be formed distant from the side S1 where the heating element is disposed.

Specifically, the groove 125 may be closer to one side S2 opposite to the side S1 where the heating element is disposed. For example, when a distance from the center of the groove to the side S1 where the heating element is disposed is a2 and a distance from the center to the opposite side S2 is a1, there may be a1<a2.

The display device shown in FIG. 5 may reduce or prevent deterioration of the performance or lifespan of the organic element such as an organic light emitting diode due to heat. The display device shown in FIG. 5 may be suitable for a display device including an organic light emitting diode display panel, for example.

Figure 6:
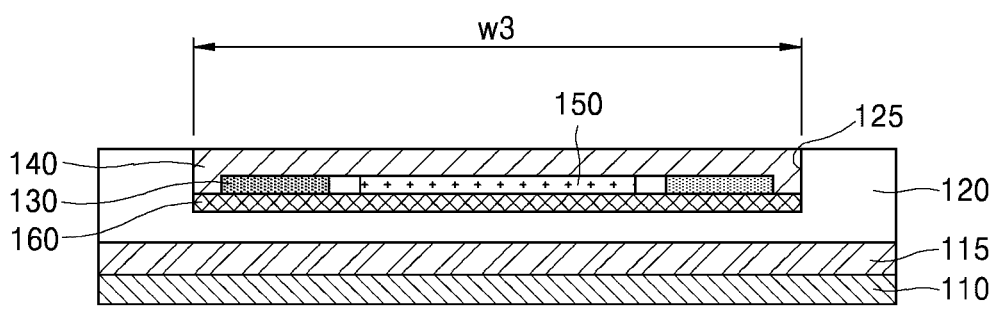
FIG. 6 is a sectional view schematically illustrating a display device according to a still further embodiment.
Figure 7:
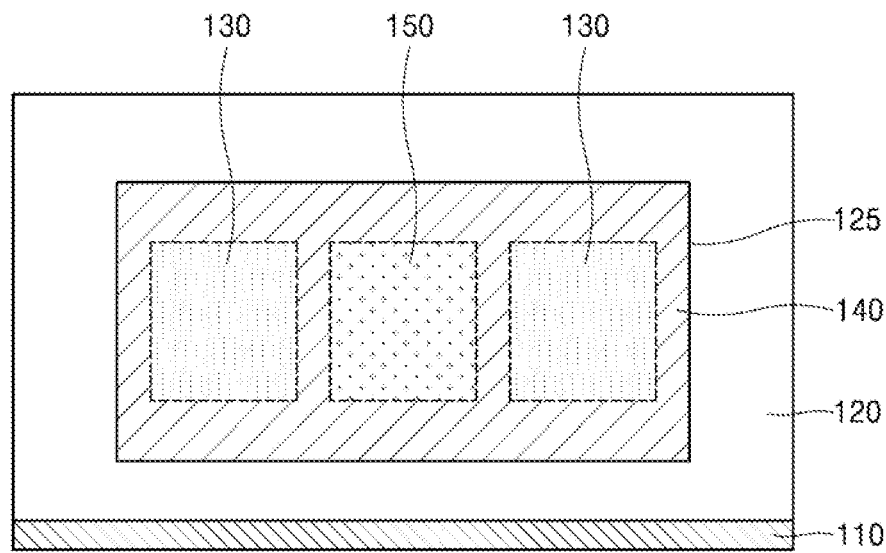
FIG. 7 shows schematically a rear surface of the display device shown in FIG. 6.

FIG. 6 is a sectional view schematically illustrating a display device according to a still further embodiment. FIG. 7 shows schematically a rear surface of the display device shown in FIG. 6.

The display device shown in FIG. 6 may include a metal layer 120 having a rear surface where a groove 125 is formed; a display panel 110 disposed on a front surface of the metal layer; and a piezoelectric film type actuator 130 disposed in the groove 125, which is similar to the display device shown in FIGS. 2 and 4. Accordingly, most of the features of the display device shown in FIGS. 2 and 4 may also be applied to the display device shown in FIG. 6, and repeated descriptions may be excluded.

Meanwhile, the display device shown in FIG. 6 may be characterized in that the drive 150 together with the piezoelectric film type actuator 130 is disposed in the groove 125 of the metal layer 120. In addition, the display device shown in FIG. 6 may be characterized in that the drive 150 and the connecting wires 131 are not exposed on the rear surface of the metal layer.

The display device shown in FIGS. 6 and 7 will be described in more detail as follows.

The drive 150 may be disposed in the groove of the metal layer 120. As one example, the drive may be disposed in a center area of the groove 125.

The piezoelectric film type actuator 130 may be disposed in at least one side of the drive 150. As shown in FIG. 6, the drive 150 and the piezoelectric film type actuator 130 may be disposed at a preset interval. As another example, the drive 150 and the piezoelectric film type actuator 130 may be spaced a preset distance apart from each other, and the enclosure may be provided in the space between them. As one further example, the drive 150 and the piezoelectric film type actuator 130 may be disposed without spacing.

In the display device shown in FIGS. 6 and 7, the drive 150 may be disposed in the center of the groove 125 and the piezoelectric film type actuators 130 may be disposed on both sides of the groove 125. In this instance, the size w3 of the groove may be relatively large and it may be advantageous in securing a side vibration area.

The piezoelectric film type actuators 130 may be electrically connected with the drive 150 via connecting wires.

The enclosure 140 may cover the rear surface of the drive 150 and rear surfaces of one or more piezoelectric film type actuators 130. The enclosure 140 may cover even the lateral surfaces of the piezoelectric film type actuators 130 as shown in FIG. 6.

A heat dissipation sheet 160 may be disposed on the front surface of the drive 150 and the front surfaces of the piezoelectric film type actuators 130. As one example, the drive 150 and the plural piezoelectric film type actuators 130 may be disposed on the rear surface of the heat dissipation sheet. They may be covered by one enclosure 140.

The display device shown in FIGS. 6 and 7 may widen the vibration area and improve the exterior of the rear surface, since the drive 150 and the connecting wires are covered by the enclosure 140.

Figure 8:
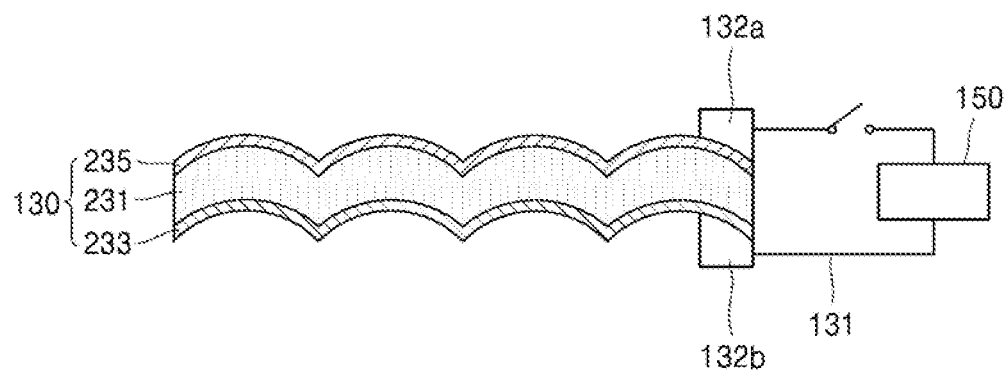
FIG. 8 shows schematically one example of a piezoelectric film type actuator that may be used in the display device of the present disclosure.

FIG. 8 shows schematically one example of a piezoelectric film type actuator that may be used in the display device of the present disclosure.

As shown in the example of FIG. 8, the piezoelectric film type actuator 130 may be formed in a curved pattern. The directionality of the sound may be controlled through frequency synthesis of the sound output by the curved pattern of the piezoelectric film type actuator 130.

The piezoelectric film type actuator 130 may be formed of a piezoelectric film alone, or the piezoelectric film may be attached to a support plate. The piezoelectric film type actuator 130 may output a sound in an audible frequency band by vibrating based on a frequency input.

Referring to FIG. 8, the piezoelectric film type actuator 130 may have a structure in which a first electrode layer 233, a piezoelectric element layer 231 and a second electrode layer 235 are multilayered. The first electrode layer 233 and the second electrode layer 235 may be electrically connected with the drive 150.

The piezoelectric element layer 231 is may be formed of a variety of known piezoelectric materials, such as a piezoelectric ceramic such as $PtZrTiO_3$, $BaTiO_3$, $Pb(Zr, Ti)O_3$) and a piezoelectric polymer such as PVDF (Poly vinylidene fluoride), P(VDF-TrFe)(poly(vinylidene fluoride-trifluoroethylene)), (VDFTeFE) (poly(vinylidene fluoride-tetrafluoroethylene)).

The first electrode layer 233 may be disposed on one surface of the piezoelectric element layer, and the second electrode layer 235 may be disposed on the other surface of the piezoelectric element layer. Terminal portions 132a and 132b may be disposed on the first electrode layer 233 and the second electrode layer 235, respectively.

The piezoelectric element layer 231 may be deformed in at least one of the thickness direction or the longitudinal direction based on the sound signal applied to the first electrode layer 233 and the second electrode layer 235, and it may output a sound through the vibration generated by the deformation. Specifically, the piezoelectric element layer 231 may output sound by vibrating while expanding and contracting in at least one of the thickness direction or the longitudinal direction.

The embodiments are described above with reference to a number of illustrative embodiments thereof. However, the present disclosure is not intended to limit the embodiments and drawings set forth herein, and numerous other modifications and embodiments can be devised by one skilled in the art. Further, the effects and predictable effects based on the configurations in the disclosure are to be included within the range of the disclosure though not explicitly described in the description of the embodiments.

What is claimed is:

1. A display device comprising:
   a metal layer having a rear surface in which a groove is provided;
   a display panel disposed on a front surface of the metal layer;
   a drive disposed in the groove of the metal layer;
   a piezoelectric film type actuator disposed at least one side of the drive in the groove of the metal layer, and electrically connected with the drive;
   a heat dissipation sheet disposed in the groove and on a front surface of the drive and a front surface of the piezoelectric film type actuator; and
   an enclosure provided to cover a rear surface of the drive and a rear surface of the piezoelectric film type actuator.

2. The display device of claim 1, further comprising:
   an adhesive layer disposed between the piezoelectric film type actuator and the enclosure.

3. The display device of claim 1, wherein a heat conductivity of the heat dissipation sheet is higher than a heat conductivity of the metal layer.

4. The display device of claim 1, wherein the heat dissipation sheet is a carbon-based heat dissipation sheet.

5. The display device of claim 1, further comprising:
   a plurality of adhesive layers disposed between the heat dissipation sheet and the metal layer and between the heat dissipation sheet and the piezoelectric film type actuator, respectively.

6. The display device of claim 1, wherein the enclosure is made of a same material as the metal layer.

7. The display device of claim 1, further comprising:
   a heating element disposed on one side of the display panel or the metal layer,
   wherein the groove is disposed closer to another side opposite to the one side where the heating element is disposed.

8. The display device of claim 1, further comprising:
   an adhesive layer including a getter material, and disposed between the metal layer and the display panel.

* * * * *